(12) United States Patent
Said

(10) Patent No.: US 8,305,244 B2
(45) Date of Patent: Nov. 6, 2012

(54) CODING DATA USING DIFFERENT CODING ALPHABETS

(75) Inventor: Amir Said, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1604 days.

(21) Appl. No.: 11/787,613

(22) Filed: Apr. 16, 2007

(65) Prior Publication Data

US 2008/0252498 A1 Oct. 16, 2008

(51) Int. Cl.
*H03M 7/34* (2006.01)
(52) U.S. Cl. .............. 341/51; 341/50; 341/67; 341/107
(58) Field of Classification Search .................. 341/50, 341/51, 65, 107
See application file for complete search history.

(56) References Cited

U.S. PATENT DOCUMENTS

| 6,373,411 B1* | 4/2002 | Shoham ..................... 341/65 |
| 6,373,412 B1* | 4/2002 | Mitchell et al. ............... 341/65 |
| 7,095,344 B2* | 8/2006 | Sekiguchi et al. ............ 341/107 |
| 7,161,507 B2* | 1/2007 | Tomic ........................ 341/51 |
| 2003/0076245 A1* | 4/2003 | Gibson et al. ................ 341/50 |
| 2006/0055569 A1* | 3/2006 | Tomic ........................ 341/50 |
| 2006/0290539 A1* | 12/2006 | Tomic ....................... 341/50 |

* cited by examiner

*Primary Examiner* — Jean B Jeanglaude

(57) ABSTRACT

A plurality of segments of the sequence are identified, wherein a segment of the plurality of segments includes at least one unsigned integer of the unsigned integer data, and wherein the plurality of segments are based in part on context within the sequence. The plurality of segments are coded, wherein each segment of the plurality of segments is coded using a different coding alphabet, wherein a coding alphabet is constrained at least by unsigned integers of a corresponding segment.

20 Claims, 8 Drawing Sheets

| Coefficient Value 210 | 0 | ±1 | ±2 | ±3 | ±4 | ±5 | ±6 | ±7 | ±8 | ±9 | ±10 | ±11 | ±12 | ±13 | ±14 | ±15 |
|---|---|---|---|---|---|---|---|---|---|---|---|---|---|---|---|---|
| Group Symbol 212 | 0 | 1 | 2 | 2 | 3 | 3 | 3 | 3 | 4 | 4 | 4 | 4 | 4 | 4 | 4 | 4 |
| Symbol Index and Sign 214 |  | ± | ±,0 | ±,1 | ±,0 | ±,1 | ±,2 | ±,3 | ±,0 | ±,1 | ±,2 | ±,3 | ±,4 | ±,5 | ±,6 | ±,7 |

| Coefficient Value 230 | 0 | ±1 | ±2 | ±3 | ±4 | ±5 | ±6 | ±7 | ±8 | ±9 | ±10 | ±11 | ±12 | ±13 | ±14 | ±15 |
|---|---|---|---|---|---|---|---|---|---|---|---|---|---|---|---|---|
| Group Symbol 232 | 0 | 1 | 2 | 3 | 4 | 4 | 5 | 5 | 6 | 6 | 6 | 6 | 7 | 7 | 7 | 7 |
| Symbol Index and Sign 234 | | ± | ± | ± | ±,0 | ±,1 | ±,0 | ±,1 | ±,0 | ±,1 | ±,2 | ±,3 | ±,0 | ±,1 | ±,2 | ±,3 |

CODING DATA USING DIFFERENT CODING ALPHABETS

FIELD

The present invention relates to the field of data compression.

BACKGROUND

Many organizations and businesses, such as those that require or provide photo printing, personal wireless communications and data storage services, are confronted with the problem of transmitting and storing very large volumes of data. For example, due to the ever increasing availability of digital cameras, due in part to reduced cost and inclusion in other electronic device such as cellular telephones and personal digital assistants (PDAs), large numbers of digital images are being created. In general, the amount of image data is approaching the order of petabytes ($10^{15}$ bytes). Because of the high costs associated with the transmission and storage of large quantities of data is substantial, it is economically beneficial to increase the efficiency of data compression used for images.

For example, the JPEG format is used for compressing the vast majority of digital images. JPEG allows for the reduction of filed sizes by re-encoding the images with the settings set for higher compression. While this is an effective way to reduce bandwidth and storage, it causes irreversible loss in image quality. Thus, before using this approach it is necessary to consider how much degradation is acceptable, and to carefully evaluate possible unexpected consequences, including lawsuits for damaging content.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 2A and 2B illustrate examples of different forms of symbol grouping, in accordance with embodiments of the present invention.

The drawings referred to in this description should not be understood as being drawn to scale except if specifically noted.

DESCRIPTION OF EMBODIMENTS

Various embodiments of the present invention, coding data using different coding alphabets, are described herein. In accordance with one embodiment of the present invention, a method for coding unsigned integer data of a sequence is provided. A plurality of segments of the sequence are identified, wherein a segment of the plurality of segments comprises at least one unsigned integer of the unsigned integer data, and wherein the plurality of segments are based in part on context within the sequence. The plurality of segments are coded, wherein each segment of the plurality of segments is coded using a plurality of sets of coding alphabets, selected according to the data sequence, wherein a coding alphabet is constrained at least by unsigned integers of a corresponding segment.

Reference will now be made in detail to various embodiments of the present invention, examples of which are illustrated in the accompanying drawings. While the present invention will be described in conjunction with the various embodiments, it will be understood that they are not intended to limit the invention to these embodiments. On the contrary, embodiments of the present invention are intended to cover alternatives, modifications and equivalents, which may be included within the spirit and scope of the appended claims. Furthermore, in the following description of various embodiments of the present invention, numerous specific details are set forth in order to provide a thorough understanding of embodiments of the present invention. In other instances, well known methods, procedures, components, and circuits have not been described in detail as not to unnecessarily obscure aspects of the embodiments of the present invention.

Embodiments of the present invention leverage the decreasing average energy distribution of block transform coefficients, like the discrete cosine transform (DCT), commonly used for image, video and audio coding. Embodiments of the present invention use a recursive selection of different coding contexts, such that alphabets required for coding symbols are constrained by previous symbols, which allows for context-based coding with low computational complexity. For purposes of the instant specification, the terms alphabet and coding alphabet are equivalent and interchangeable.

Figure 1:
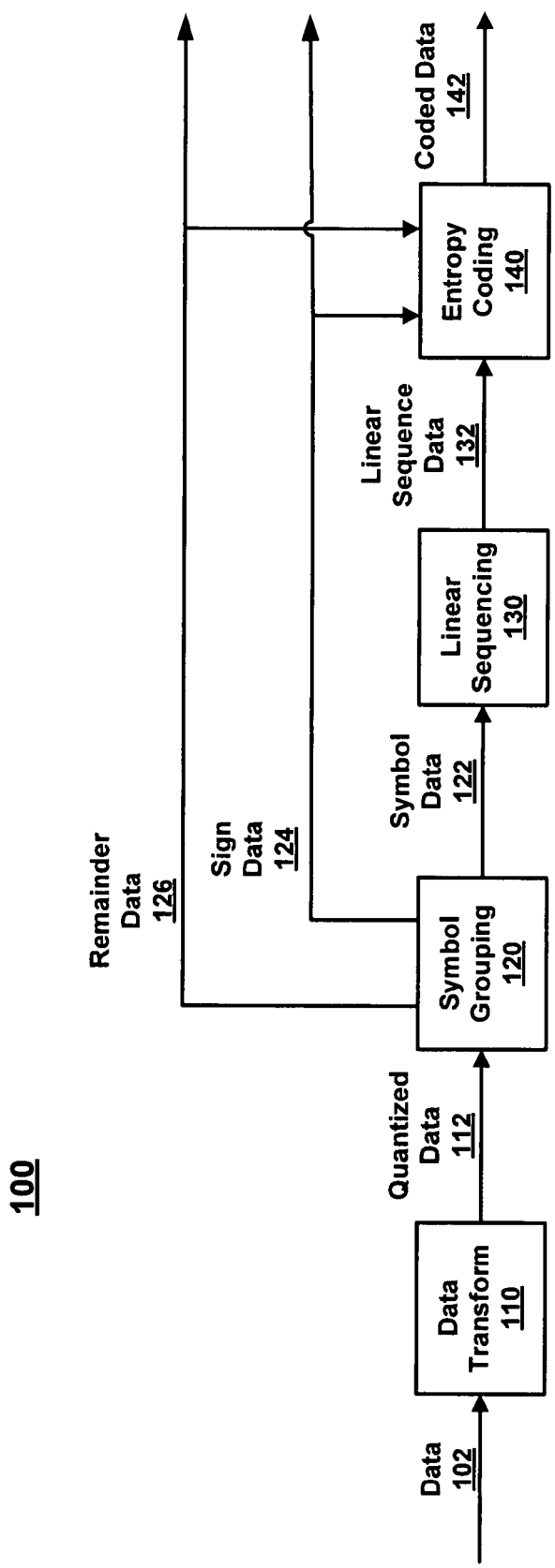
FIG. 1 is a block diagram illustrating a data compression system, in accordance with an embodiment of the present invention.

FIG. 1 is a block diagram illustrating a data compression system 100, in accordance with an embodiment of the present invention. Data compression system 100 includes data transform module 110, symbol grouping module 120, sequencing module 130, and coding module 140. In one embodiment, coding module 140 is operable to code a sequence using different alphabets to code different segments of the sequence. It should be appreciated that data compression system 100 can be implemented as software, hardware, firmware, or any combination thereof. Moreover, it should be appreciated that data compression system 100 may include additional components that are not shown so as to not unnecessarily obscure aspects of the embodiments of the present invention.

Data compression system 100 receives data 102. It should be appreciated that the data 102 can include any data in the form of signed integers. In one embodiment, the data 102 is organized in an array. Examples of data 102 that may be compressed using the described embodiments include without limitation image, video, and audio data in their basic format (raster and wave samples), or in compressed format (JPEG, MPEG, MP3), wherein the compressed data has been parsed and at least partially decompressed to recover its basic components. While embodiments of the present invention describe the compression of image data, embodiments of the present invention are not limited to these embodiments.

Data 102 is received at data transform module 110. Data transform module performs a transform on the data 102, generating quantized data 112. For instance, for image and video compression, data is arranged in two-dimensional arrays with dimension N×M. Quantized data 112 is a transformed two-dimensional array having dimension N×M, where each element is the quantized (e.g., rounded) value of a linear transform, such as the DCT or the discrete wavelet transform (DWT). The marginal distribution of the magnitude of these coefficients is roughly geometric, which means that the symbol zero is the most common, and probabilities fall very quickly with the magnitude. In one embodiment, quantized data 112 is characterized by the decreasing average energy distribution of block transform coefficients.

Quantized data 112 is received at symbol grouping module 120. In one embodiment, symbol grouping module 120 is operable to reduce complexity of the quantized data 112. For example, quantized data 112 may include signed integers in a wide range (e.g., several thousand symbols). However, the data that requires coding can be represented with unsigned integers in a much smaller range (e.g., 0, 1, . . . , 19). In one embodiment, symbol grouping module 120 is operable to reduce the range and remove the sign of the quantized data 112 that requires coding.

In one embodiment, symbol grouping module 122 is operable to generate symbol data 122 based on quantized data 112. In one embodiment, symbol data 122 comprises unsigned integers of a range smaller than that of integers of quantized data 112. Moreover, symbol grouping module 120 is operable to generate sign data 124 and remainder data 126 based on quantized data 112. In one embodiment, the sign data 124 and the remainder data 126 are forwarded to coding module 140 for coding. In another embodiment, the sign data 124 and the remainder data 126 are output from data compression system 100 as side information to coded data 142. In the present embodiment, a decoder can utilize the sign data 124 and the remainder data 126 in decoding coded data 142.

FIGS. 2A and 2B illustrate examples of different forms of symbol grouping, in accordance with embodiments of the present invention. FIG. 2A illustrates an example of symbol grouping 200 in accordance with the JPEG standard. Symbol grouping 200 illustrates how a coefficient value 210 is input into symbol grouping module 120 for generating a group symbol 212 and symbol index and sign 214 as output. The group symbol 212 is the portion of the coefficient value 210 that is coded, removing the complexity of the increased range and sign from the coding. For example, a coefficient value +7 is located in group 3, with symbol sign + and index 3. Thus, it can be coded with the sequence (3, +, 3). Similarly, coefficient value −8 is located in group 4, with sign − and index 0, and can be coded as (4, −, 0). It should be appreciated that in one embodiment, the symbol index and sign, also referred to herein as remainder data and sign data, are transmitted to coding module 140 for coding with the group symbols.

FIG. 2B illustrate an example of symbol grouping 220 in accordance with a second embodiment. Symbol grouping 220 illustrates how a coefficient value 230 is input into symbol grouping module 120 for generating a group symbol 232 and symbol index and sign 234 as output. The group symbol 232 is the portion of the coefficient value 230 that is coded, removing the complexity of the increased range and sign from the coding. For example, a coefficient value +7 is located now in group 5, with symbol sign + and index 1, and should be coded as the sequence (5, +, 1), while coefficient value −8 should be coded with (6, −, 0).

It should be appreciated that symbol grouping can be performed in many different ways, that the embodiments illustrated in FIGS. 2A and 2B are examples, and that other ways and embodiments of symbol grouping can be performed by symbol grouping module 120. Moreover, any symbol grouping operation that reduces the range and removes the sign of the original data can be used.

With reference to FIG. 1, symbol data 122 is received at sequencing module 130. In one embodiment, sequencing module 130 is operable to arranged symbol data 122 into a sequence. For instance, in one embodiment symbol data 122 is arranged in a multidimensional array. Sequencing module 130 is operable to rearrange the multidimensional array to a certain number P of sequences of K elements. In other words, in one embodiment, sequencing module 130 is operable to rearrange data from a two-dimensional array to at least one one-dimensional sequence. Moreover, due to the characteristics of transform data, sequence data 132 is roughly arranged in such a way that the expected value of the data symbols decrease with the sequence index. Thus, the first symbol in one of these sequences is expected to be larger than the second, which is expected to be larger than the third, and so on. It should be appreciated that it is not always possible to create sequences that satisfy this condition exactly, and that some symbols in the sequence may have a greater value than the previous symbol. Embodiments of the present invention leverage the generally decreasing average energy distribution of the quantized data, and do not require that the sequence data 132 decrease perfectly, as described in accordance with FIG. 4.

In other embodiments, some of the coefficients may be coded separately. For example, for an 8×8 DCT block, the DC component may be coded separately and the remaining components may be coded in 3 sequences of 21 symbols.

Figure 3A:
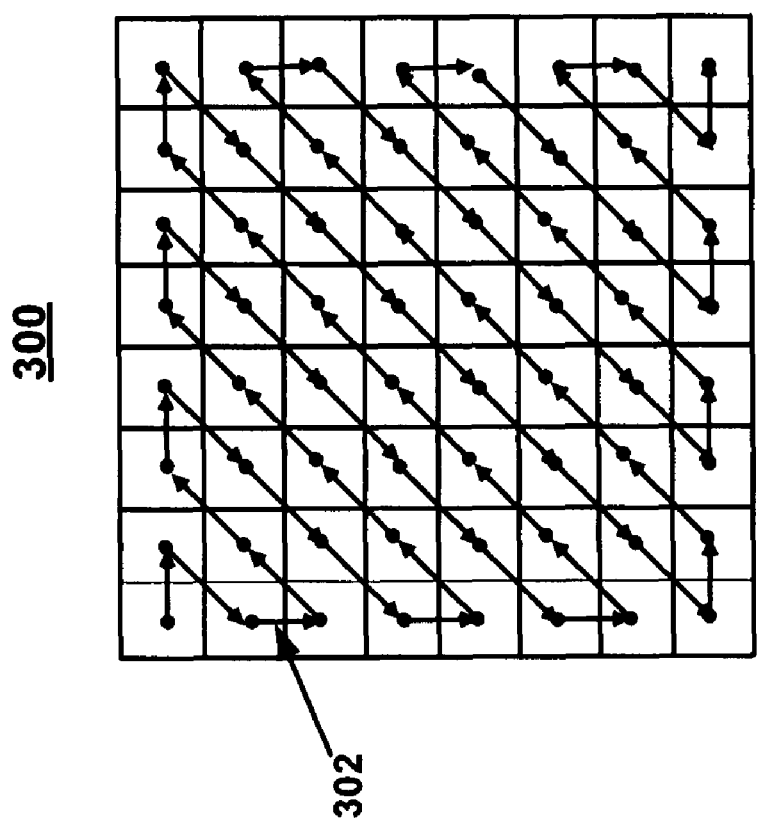
FIGS. 3A and 3B illustrate examples of different forms of sequencing, in accordance with embodiments of the present invention.
Figure 3B:
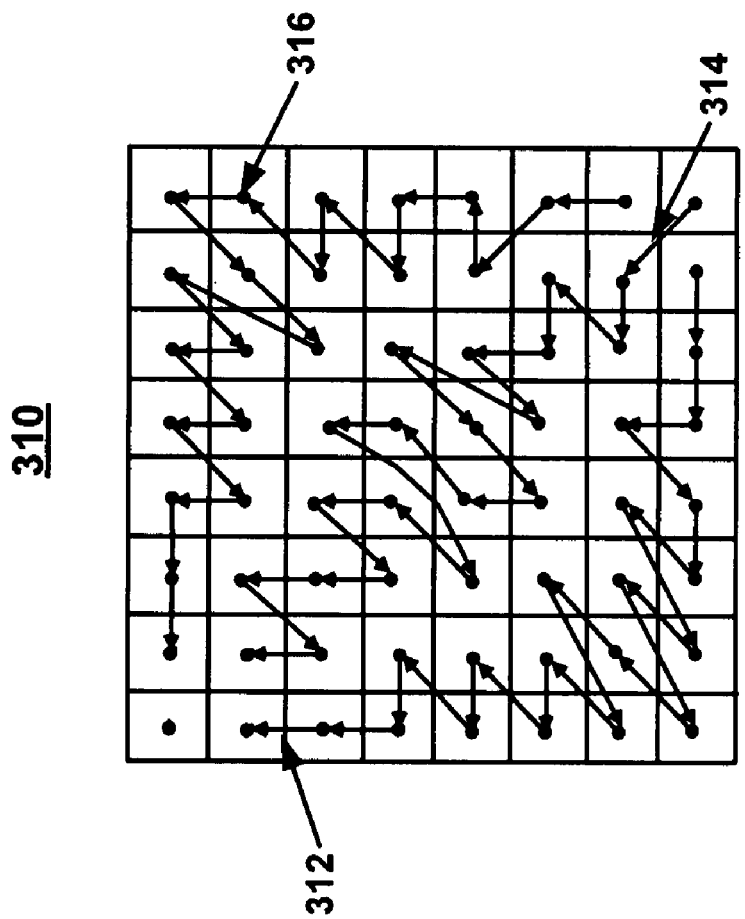

FIGS. 3A and 3B illustrate examples of different forms of sequencing, in accordance with embodiments of the present invention. FIG. 3A illustrates an example of sequence 302 of a block 300 in accordance with the JPEG standard. Sequence 302 for JPEG follows a zigzag order, starting from the low-frequency coefficients at the upper left of block 300, and progressing in the zigzag order shown to the lower right corner of block 300.

FIG. 3B illustrates an example of multiple sequences of a block 310 in accordance with another embodiment. The embodiment illustrated in FIG. 3B includes sequences 312, 314 and 316 that are based on statistical criterion and reduces the vertical or horizontal edges and gradient orientations. In one embodiment, sequences 312, 314 and 316 are selected based on the statistical properties of the DCT coefficients or group symbols. In another embodiment, sequences 312, 314 and 316 allow for coding the coefficients or group symbols starting from high frequencies, and the first symbol to be coded is the position of the first non-zero coefficient in each sequence. In one embodiment, selecting multiple sequences in this manner provides for easier prediction as to how the coefficient magnitudes increase, and to use the previously-coded symbols as context for model selection.

It should be appreciated that symbol grouping module 120 and sequencing module 130 can perform their respective operations in any order. For instance, in the above-described embodiment illustrated in FIG. 1, symbol grouping module 120 performs a symbol grouping operation and provides output of the symbol grouping operation to sequencing module 130 for performing a sequencing operation. In another embodiment, sequencing module 130 performs a sequencing operation and provides output of the sequencing operation to symbol grouping module 120 for performing a symbol grouping operation.

With reference to FIG. 1, sequence data 132 is received at coding module 140. In one embodiment, coding module 140 is operable to code sequence data 132. In one embodiment, coding module 140 encodes sequence data for transmission to a destination decoder. In one embodiment, coding module 140 performs entropy coding on sequence data 132. It should be appreciated that additional data, e.g., sign data 124 and remainder data 126, can be coded together with the group symbols at coding module 140. Such details are omitted to simplify and avoid unnecessarily obscuring embodiments of the present invention.

In one embodiment, coding module 140 is operable to first determine whether all the symbols in all the P sequences of a block are zero, and code this information using a binary alphabet (e.g., 0 for no and 1 for yes). In one embodiment, this information can be coded using as context (e.g., for conditional entropy coding) other information. For example, the information can be coded using how many times the same event occurred on previously coded blocks as context.

In one embodiment, where at least on symbol in the P sequences is not zero, coding module 140 is operable to identify a plurality of segments of the sequences and to code the segments using different alphabets. A segment of a sequence includes at least one value (e.g., group symbol or unsigned integer). A coding alphabet is constrained at least by values of a corresponding segment. In one embodiment, subsequent segments of the plurality of segments are coded using progressively larger alphabets.

In one embodiment, coding module 140 identifies segments by progressively searching a sequence. Beginning from the low magnitude end (e.g., value $v_{K-1}$), the value of the first unsigned integer is determined. The sequence is then progressively searched for the first value greater than the value of the first unsigned integer. This unsigned integer is referred to herein as the second unsigned integer, and more generally as a segment separator. A segment is identified as all unsigned integers between and not including the first unsigned integer and an unsigned integer immediately prior to the segment separator as a first segment.

In one embodiment, the sequence is progressively searched until all segments are identified. In one embodiment, the sequence is progressively searched for the next unsigned integer, referred to herein as a third unsigned integer, having a value greater than the value of the second unsigned integer. Unsigned integers between and not including the second unsigned integer and an unsigned integer immediately prior to the third unsigned integer are identified as a second segment.

Segments are then coded, where each segment is coded using a plurality of different coding alphabets. In particular, the data segment, the segment separator and the segment separator position are coded using different coding alphabets. In one embodiment, the first segment of is coded using a first coding alphabet and subsequent segments are coded using progressively larger coding alphabets. In one embodiment, the segments are coded using binary alphabets. In one embodiment, the segments are coded using arithmetic coding.

In one embodiment, consider an example block having P sequences. For each of the P sequences, initialize $t=0$, $n=K$. The position $p<n$ of the last coefficient in the sequence with value greater than t is coded, using $p=-1$ to indicate if no value is found. This position is coded using an alphabet with $n+1$ symbols, and also using n, t and other relevant information as context. For example, if $n=K$, the context can be the same information in previous blocks, and the information from previously coded sequences in the same block. In one embodiment, if $t>0$, the values of all coefficients $\{v_{p+1}, v_{p+2}, \ldots, v_{n-1}\}$ are coded using an alphabet with $t+1$ symbols. This data also uses n, t and other relevant information as context.

In one embodiment, the position $p<n$ of the last coefficient in the sequence with value greater than t is coded, using an alphabet with symbols $\{-1, 0, 1, \ldots, n-1\}$. While $p<0$ the coding process continues through the coding of the entire sequence. Alternatively, if $p<0$, the next sequence or block is analyzed.

In one embodiment, if $p \geqq 0$, the coefficient value $v_p$ is coded using an alphabet with symbols $\{t+1, t+2, \ldots, M\}$, where M is the maximum possible value of $v_p$. In another embodiment, if $p \geqq 0$, a binary alphabet is first used to indicate if the coefficient value $v_p$ is equal to $t+1$. If $v_p$ is not equal to $t+1$, the difference $v_p - t - 1$ is coded. This data also uses the values n, t, already coded, and other relevant information as context. The values of t and n are updated as $t=v_p$ and $n=p$.

Figure 4:
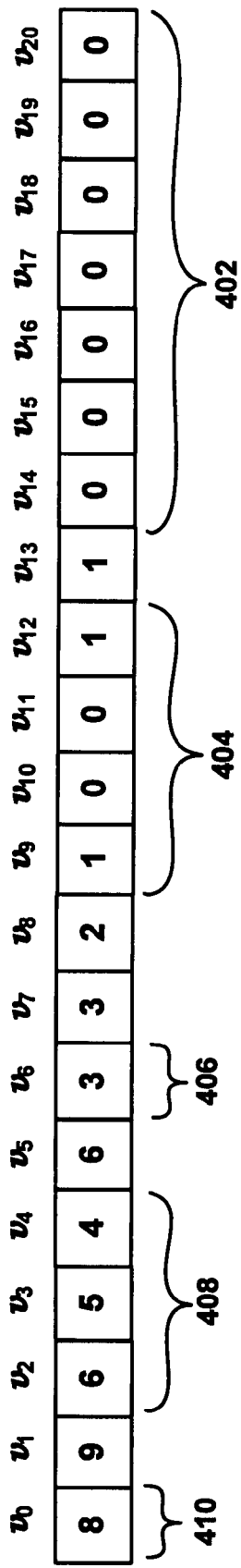
FIG. 4 illustrates an example of coding a sequence using different alphabets to code different segments of the sequence, in accordance with embodiments of the present invention.

FIG. 4 illustrates an example of coding example sequence 400 using different alphabets to code different segments of the sequence, in accordance with an embodiment of the present invention. As illustrated in FIG. 4, sequence 400 of values to be coded is represented as $\{v_0, v_1, \ldots, v_{20}\}$, where table 450 includes alphabets for coding the segment, segment separators, and segment separator positions of sequence 400. Moreover, the unsigned integers of sequence 400 are arranged in generally decreasing magnitude. Due to the characteristics of transform data, the sequence is roughly arranged in such a way that the expected value of the data symbols decrease with the sequence index. Thus, the first symbol in one of these sequences is expected to be larger than the second, which is expected to be larger than the third, and so on. It should be appreciated that it is not always possible to create sequences that satisfy this condition exactly, and that some symbols in the sequence may have a greater value than the previous symbol.

First, the end position (n) is at the end of the sequence ($n=K$), and the reference value is $t=0$. In the example of FIG. 4, $K=21$. Next, the position of a segment separator is found by selecting the largest index in the set $p=\max\{i<n: v_i>t\}$, or $-1$, is there is no $v_i>t$, where p is the segment separator position within the sequence. For example, with reference to FIG. 4, the value of the reference value $v_{20}$ is zero. Sequence 400 is then progressively searched, starting with $v_{n-1}=v_{20}$, followed by $v_{n-2}=v_{19}$, and so on, for the first value greater than the value of $t=0$. The first value greater than zero is the value one of group symbol $v_{13}$, where $v_{13}$ is a segment separator. Segment 402 is identified as all group symbols between and including group symbol $v_{20}$ and group symbol $v_{14}$, where group symbol $v_{14}$ immediately precedes group symbol $v_{13}$. In one embodiment, segment 402 is then coded using coding alphabet 422 which comprises values $\{0, \ldots t\}$. In this first case the alphabet has only one value: zero. In the example where $p=13$, the first segment separator is $v_{13}$. Since the possible values of p are between $-1$ and $K-1=20$, the information is coded with an alphabet covering this interval.

Next, the value of $v_{13}$ is coded. The value of $v_{13}$ is larger than $t=0$ and smaller than a maximum symbol value M, where $M=21$, so the alphabet for this element covers this range. The elements in segment 402 can only be zero. In one embodiment, information on an alphabet with only one symbol does not need to be coded because it is already known. It should be appreciated that for a segment comprising solely of the value zero, in various embodiments, the segment values do not need to be coded because, from the context the decoder knows that the segment values can only have the value equal to zero.

In the present embodiment, since the first value of p is positive, the values of n and t are updated as $n=p=13$, and $t=v_{13}=1$, and sequence 400 is progressively searched until all group symbols are searched. For instance, once segment 402 is identified, the rest of sequence 400 is progressively searched backwards, starting from $v_{12}$, until the first group symbol having a value greater than the value of t is found. The first value greater than one is the value two of group symbol $v_8$. Segment 404 is identified as all group symbols between and not including group symbol $v_{13}$ and group symbol $v_9$, where group symbol $v_9$ immediately precedes group symbol $v_8$, where $v_8$ is a segment separator.

Next, the position p=8 of the segment separator is coded using an alphabet $\{-1, 0, 1, \ldots, 12\}$. It should be appreciated that the new value of p can be coded with a smaller alphabet, because p now must be smaller than the previous p (13).

Next, the value of $v_8$ is coded, where $v_8=2$ is a segment separator, is coded with alphabet $\{2, 3, 4, \ldots, M-1\}$ and elements $\{v_9, v_{10}, v_{11}, v_{12},\}$ are coded with alphabet $\{0, 1\}$. It should be appreciated that the value of $v_8$ can be coded with a smaller alphabet, because $v_8$ now must be larger than the previous segment separator $v_{13}$. It should also be appreciated that, in general, the size of the alphabets for coding the segment separator position and segment separator value always decrease, while the size of the alphabet to code the segment elements always increase.

Sequence 400 is progressively searched in the manner described until all group symbols are searched and encoded. For example, segments 406, 408 and 410 are identified in sequence 400. Because segment separators $v_7$ and $v_8$ are adjacent, the segment between them is the empty set, and thus no elements in that segment need to be coded. Segment 406 is coded using a coding alphabet which comprises four values: zero, one, two, and three, segment 408 is coded using coding alphabet which comprises six values: zero through six and segment 410 is coded using coding alphabet which comprises nine values: zero through nine. Moreover, the segment separators $v_7$, $v_5$, and $v_1$ and their respective positions are coded using different alphabets. Symbol $v_7$ is coded using an alphabet $\{3, \ldots, 21\}$ where the separator position p=7 is coded using alphabet $\{-1, \ldots, 7\}$, symbol $v_5$ is coded using an alphabet $\{4 \ldots, 21\}$ where the separator position p=5 is coded using alphabet $\{-1, \ldots, 6\}$, and symbol $v_1$ is coded using an alphabet $\{7, \ldots, 21\}$ where the separator position p=1 is coded using alphabet $\{-1, \ldots, 4\}$. The final separator position is coded alphabet $\{-1, 0\}$. It should be appreciated that the example sequence 400 is an example, and that different sequences may include different values, resulting in different segmentation and coding alphabets.

Embodiments of the present invention provide for enhanced exploitation of the contextual information of a sequence that yields improved compression, while using this information as a part of the coding process itself. This enables achieving very good compression with low complexity. For instance, the constraint imposed by the information already coded allows for coding the subsequent data using an alphabet with the absolute minimum number of symbols.

It should be appreciated that the variety of information to be coded may use a large number of codes (e.g., thousands), with different alphabet sizes, and for each alphabet, different sets of contexts. In one embodiment, memory pointers in memory are used to address the required number of codes. Since some conditions that define code selection are much more probable than others, the information about the most used codes should be commonly found in the fast caches.

Figure 5:
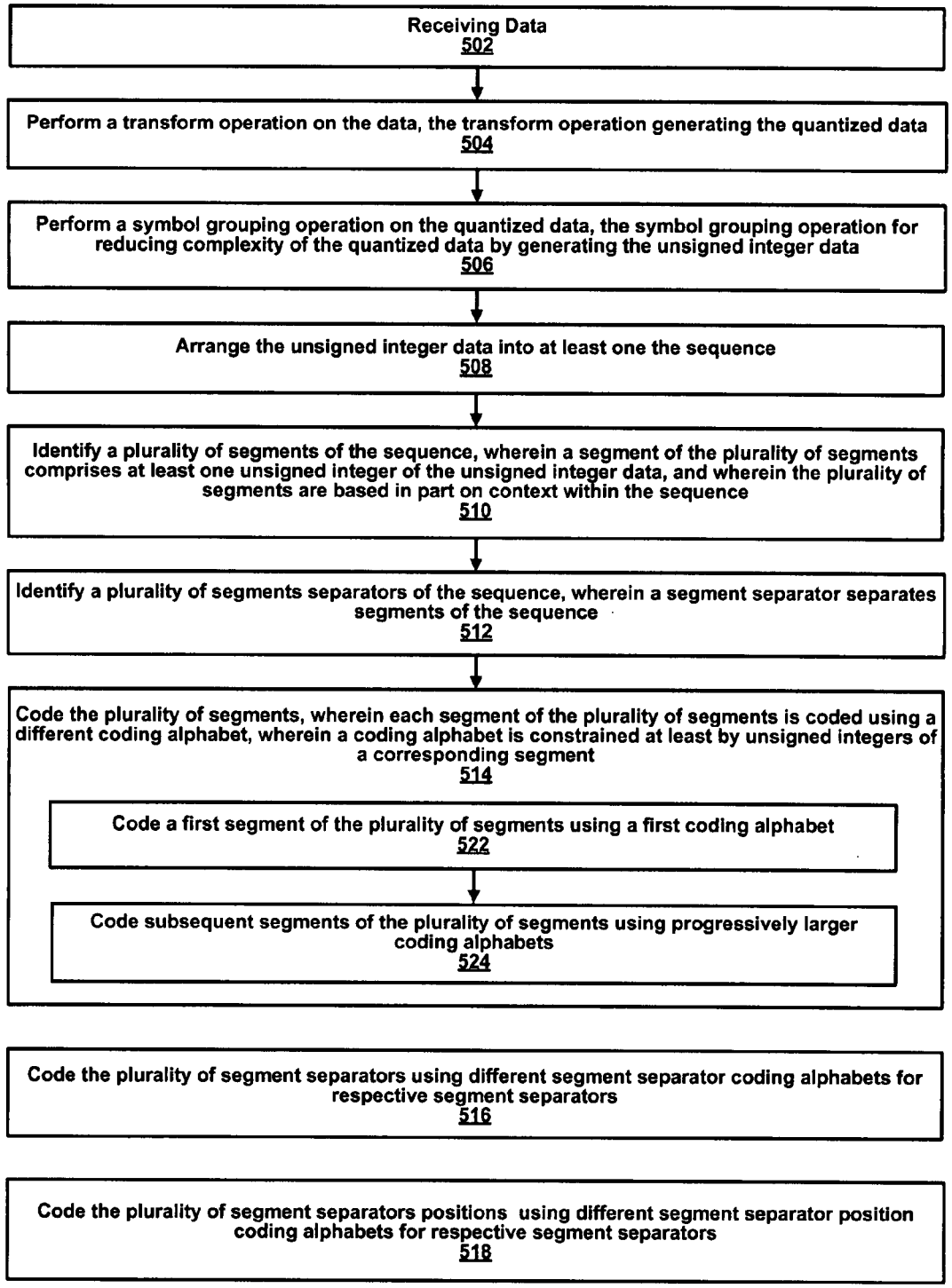
FIG. 5 is a flow chart illustrating a process for compressing data, in accordance with an embodiment of the present invention.

FIG. 5 is a flow chart illustrating a process 500 for compressing data, in accordance with an embodiment of the present invention. In one embodiment, process 500 is carried out by processors and electrical components under the control of computer readable and computer executable instructions. The computer readable and computer executable instructions reside, for example, in data storage features such as computer usable volatile and non-volatile memory. However, the computer readable and computer executable instructions may reside in any type of computer readable medium. In one embodiment, process 500 is performed by data compression system 100 of FIG. 1

At 502, data is received. In one embodiment, the data is in the form of signed integers. In one embodiment, the data is organized in an array. Examples of data that may be compressed using the described embodiments include without limitation image data (e.g., JPEG data), video data (e.g., MPEG data), and audio data (e.g., WAVE data and MP3 data). While embodiments of the present invention describe the compression of image data, embodiments of the present invention are not limited to these embodiments.

At 504, a transform operation is performed on the data, in which the transform operation generates quantized data. For instance, for image and video compression, data is arranged in two-dimensional arrays with dimension N×M. The quantized data is a transformed two-dimensional array having dimension N×M, where each element is the quantized (e.g., rounded) value of a linear transform, such as the DCT or DWT. The marginal distribution of the magnitude of these coefficients is roughly geometric, which means that the symbol zero is the most common, and probabilities fall very quickly with the magnitude. In one embodiment, the quantized data is characterized by the decreasing average energy distribution of block transform coefficients.

At 506, a symbol grouping operation is performed on the quantized data, in which the symbol grouping operation reduces complexity of the quantized data by generating unsigned integer data. In one embodiment, the symbol grouping operation reduces the range of values of the quantized data and removes the signs of the quantized data. In one embodiment, the symbol data comprises unsigned integers having a smaller magnitude than the quantized data.

In one embodiment, the symbol grouping operation generates sign and remainder data. In one embodiment, the sign and remainder data are used in coding the symbol data. In another embodiment, the sign and remainder data are output as side information for use in decoding coded data.

At 508, the unsigned integer data is arranged into at least one sequence. In one embodiment, the symbol data is rearranged from a multidimensional array to a certain number P of sequences of K elements. In other words, in one embodiment, the symbol data is rearranged from a two-dimensional array to a one-dimensional sequence. In one embodiment, the sequence includes unsigned integer data arranged in generally decreasing magnitude. Due to the characteristics of transform data, the sequence data is roughly arranged in such a way that the expected value of the data symbols decrease with the sequence index. Thus, the first symbol in one of these sequences is expected to be larger than the second, which is expected to be larger than the third, and so on. It should be appreciated that it is not always possible to create sequences that satisfy this condition exactly, and that some symbols in the sequence may have a greater value than the previous symbol. Embodiments of the present invention leverage the generally decreasing average energy distribution of the quantized data, and do not require that the sequence data decrease perfectly.

It should be appreciated that 506 and 508 can be performed in any order. For instance, in the above-described embodiment the symbol data is rearranged into a sequence. In another embodiment, the quantized data can be arranged into a sequence, and the symbol grouping operation of 506 can be performed on the sequence.

At 510, a plurality of segments of the sequence is identified. A segment of the plurality of segments includes at least one unsigned integer of the unsigned integer data. At 512, a plurality of segment separators of the sequence are identified, wherein a segment separator separates segments of the sequence. The plurality of segments is based in part on context within the sequence. In one embodiment, the identification of segments of the sequence is performed in accordance with process 600 of FIG. 6.

Figure 6:
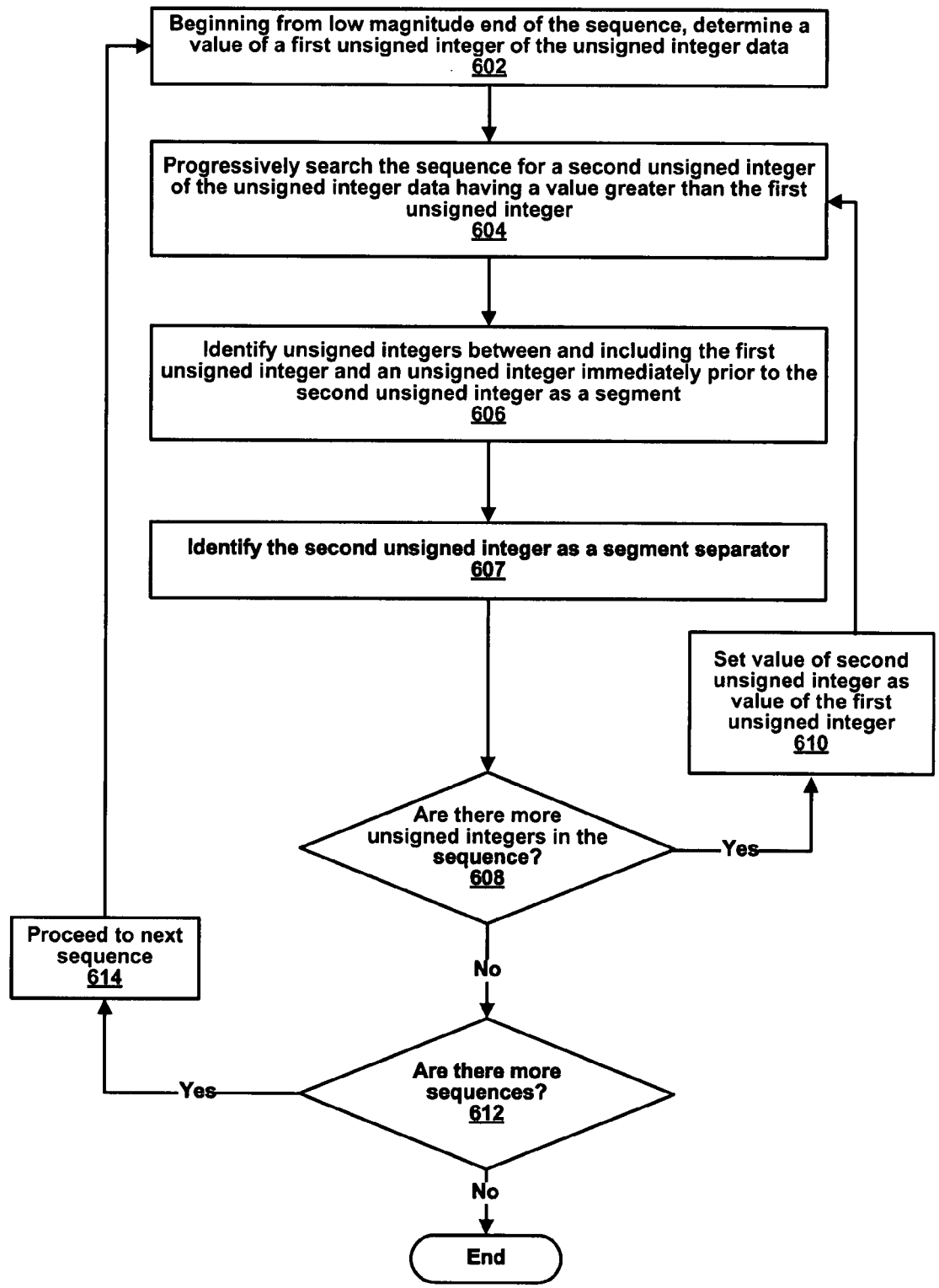
FIG. 6 is a flow chart illustrating a process for identifying segments in a sequence, in accordance with an embodiment of the present invention.

FIG. 6 is a flow chart illustrating a process 600 for identifying segments in a sequence, in accordance with an embodiment of the present invention. In one embodiment, process 600 is carried out by processors and electrical components under the control of computer readable and computer executable instructions. The computer readable and computer executable instructions reside, for example, in data storage features such as computer usable volatile and non-volatile memory. However, the computer readable and computer executable instructions may reside in any type of computer readable medium. In one embodiment, process 600 is performed by coding module 140 of FIG. 1.

At 602 of FIG. 6, beginning from low magnitude end of the sequence, a value of a first unsigned integer of the unsigned integer data is determined. At 604, the sequence is progressively searched for a second unsigned integer of the unsigned integer data having a value greater than the first unsigned integer. At 606, unsigned integers between and including the first unsigned integer and an unsigned integer immediately prior to the second unsigned integer are identified as a segment. At 607, the second unsigned integer is identified as a segment separator.

In one embodiment, upon completion of 606, the segment is coded at 514 of FIG. 5. In another embodiment, a multiple segments are identified prior to coding the segments. In one embodiment, all segments of a sequence are identified prior to coding the segments. It should be appreciated that process 500 and process 600 may be performed concurrently such that identified segments are coded while new segments are identified.

At 608, it is determined whether there are any more unsigned integers in the sequence that can be searched. If there are more unsigned integers in the sequence, as shown at 610, the value of the second unsigned integer is set as the value of the first unsigned integer, and process 600 proceeds to 604. Accordingly, process 600 is operable to identify all segments in a sequence and will not proceed to the next sequence until all unsigned integers of a sequence are searched.

If there are not any more unsigned integers in the sequence, it is determined whether there are any more sequences, as shown at 612. If there are more sequences to search, process 600 proceeds to the next sequence, as shown at 614, and proceeds to 602. In one embodiment, if there are no more sequences to search, process 600 ends.

With reference to FIG. 5, at 514, the segments are coded, wherein each segment of the plurality of the plurality of segments is coded using a different subset of coding alphabets. In one embodiment, a coding alphabet is constrained at least by unsigned integers of a corresponding segment. In one embodiment, the subsets of coding alphabets includes different alphabets for coding the data segment, the segment separator, and the position of the segment separator. In one embodiment, the segments are coded using arithmetic coding. In one embodiment, as shown at 522, a first segment of the plurality of segments is coded using a first coding alphabet. At 524, subsequent segments of the plurality of segments are coded using progressively larger coding alphabets.

It should be appreciated that segment separators and segment separators positions are also coded using different coding alphabets, as described above. Moreover, it should be appreciated that the coding of the segment separators and segment separators positions is performed as the sequence is progressively searched. In one embodiment, in general, as shown at 516, the plurality of segment separators are coded using different segment separator coding alphabets for respective segment separators. At 518, the plurality of segment separator positions are coded using different segment separator coding alphabets for respective segment separator positions.

In summary, embodiments of the present invention provide for coding of data of segments of a sequence using different alphabets, where the alphabet is constrained at least by a corresponding segment. Embodiments of the present invention provide for identifying segments of the sequence based at least in part on the context of the unsigned integers of the sequence. Embodiments of the present invention provide for enhanced exploitation of the contextual information of a sequence that yields improved compression, while using this information as a part of the coding process itself. This enables achieving very good compression with low complexity. For instance, the constraint imposed by the information already coded allows for coding the subsequent data using an alphabet with the absolute minimum number of symbols.

Various embodiments of the present invention, a coding data using different coding alphabets, are described herein. While the present invention has been described in particular embodiments, it should be appreciated that the present invention should not be construed as limited by such embodiments, but rather construed according to the following claims.

What is claimed is:

1. A method for coding unsigned integer data of a sequence, said method comprising:
   identifying a plurality of segments of said sequence, wherein a segment of said plurality of segments comprises at least one unsigned integer of said unsigned integer data, and wherein said plurality of segments are based in part on context within said sequence; and
   coding said plurality of segments, wherein each segment of said plurality of said plurality of segments is coded using a different coding alphabet, wherein a coding alphabet is constrained at least by unsigned integers of a corresponding segment.

2. The method as recited in claim 1 further comprising:
   coding a plurality of segment separators using different segment separator coding alphabets for respective segment separators, wherein a segment separator separates segments of said sequence; and
   coding positions of said plurality of segments separators within said sequence using different segment separator position coding alphabets for respective segment separator positions.

3. The method as recited in claim 1, wherein said sequence comprises said unsigned integer data arranged in generally decreasing magnitude.

4. The method as recited in claim 1 further comprising:
   receiving quantized data;
   performing a symbol grouping operation on said quantized data, said symbol grouping operation for reducing complexity of said quantized data by generating said unsigned integer data; and
   arranging said unsigned integer data into at least one said sequence.

5. The method as recited in claim 4, wherein said symbol data comprises unsigned integers having a smaller magnitude than said quantized data.

6. The method as recited in claim 1, wherein said identifying a plurality of segments of said sequence comprises:
   beginning from low magnitude end of said sequence, determining a value of a first unsigned integer of said unsigned integer data;
   progressively searching said sequence for a second unsigned integer of said unsigned integer data having a value greater than said first unsigned integer; and
   identifying unsigned integers between and including said first unsigned integer and an unsigned integer immediately prior to said second unsigned integer as a first segment.

7. The method as recited in claim 6 further comprising:
   identifying said second unsigned integer as a first segment separator.

8. The method as recited in claim 6, wherein said identifying a plurality of segments of said sequence further comprises:
   progressively searching said sequence for a third unsigned integer of said unsigned integer data having a value greater than said second unsigned integer;
   identifying unsigned integers between and not including said second unsigned integer and an unsigned integer immediately prior to said third unsigned integer as a second segment; and
   identifying said third unsigned integer as a second segment separator.

9. The method as recited in claim 1 wherein said coding said plurality of segments comprises:
   coding a first segment of said plurality of segments using a first coding alphabet; and
   coding subsequent segments of said plurality of segments using progressively larger coding alphabets.

10. The method as recited in claim 1, wherein said method further comprises:
    receiving data; and
    performing a transform operation on said data, said transform operation generating said quantized data.

11. The method as recited in claim 10 wherein said data comprises signed integers organized in an array.

12. A non-transitory computer-readable storage medium having instructions embodied therein for execution by a computer system to perform a method for compressing data, said method comprising:
    receiving quantized data;
    performing a symbol grouping operation on said quantized data, said symbol grouping operation for reducing complexity of said quantized data by generating symbol data;
    arranging said symbol data into at least one sequence;
    coding segments of said sequence and segment separators of said sequence such that said segments and said segment separators are coded using different alphabets, wherein a coding alphabet is constrained at least by symbol data of a corresponding segment.

13. The non-transitory computer-readable storage medium of claim 12 wherein said symbol data comprises unsigned integers having a smaller magnitude than said quantized data.

14. The non-transitory computer-readable storage medium of claim 12 wherein said sequence comprises said symbol data arranged in generally decreasing magnitude.

15. The non-transitory computer-readable storage medium of claim 12 wherein said coding segments of said sequence such that said segments are coded using different alphabets comprises:
    identifying a plurality of segments of said sequence, wherein a segment of said plurality of segments comprises at least one group symbol of said symbol data; and
    coding said plurality of segments, wherein each segment of said plurality of said plurality of segments is coded using a different alphabet.

16. The non-transitory computer-readable storage medium of claim 12 wherein said identifying a plurality of segments of said sequence comprises:
    beginning from low magnitude end of said sequence, determining a value of a first group symbol of said symbol data;
    progressively searching said sequence for a second group symbol of said symbol data having a value greater than said first group symbol;
    identifying group symbols between and including said first group symbol and a group symbol immediately prior to said second symbol as a first segment; and
    identifying said second symbol as a first segment separator.

17. The non-transitory computer-readable storage medium of claim 16 wherein said identifying a plurality of segments of said sequence further comprises:
    progressively searching said sequence for a third group symbol of said symbol data having a value greater than said second group symbol;
    identifying group symbols between and not including said second group symbol and a group symbol immediately prior to said third symbol as a second segment; and
    identifying said third symbol as a second segment separator.

18. The non-transitory computer-readable storage medium of claim 15 wherein said coding said plurality of segments comprises:
    coding a first segment of said plurality of segments using a first alphabet; and
    coding subsequent segments of said plurality of segments using progressively larger alphabets.

19. A data encoder comprising:
    a data transform module for performing a transform operation on received data, said transform operation generating quantized data;
    a symbol grouping module for performing a symbol grouping operation on said quantized data, said symbol grouping operation for generating symbol data based at least in part on said quantized data, said symbol grouping operation reducing complexity of said quantized data by removing a sign of said quantized data and for reducing magnitude of said quantized data;
    a sequencing module for arranging said symbol data into at least one sequence, wherein said sequence comprises said symbol data arranged in generally decreasing magnitude; and
    a coding module for identifying a plurality of segments of said sequence and for identifying a plurality of segment separators of said sequence, wherein a segment of said plurality of segments comprises at least one group symbol of said symbol data, and for coding said plurality of segments, wherein each segment of said plurality of said plurality of segments and wherein each segment separator of said plurality of segment separators is coded using a different alphabet, wherein a coding alphabet is constrained at least by symbol data of a corresponding segment, and wherein subsequent segments of said plurality of segments are coded using progressively larger alphabets.

20. The data encoder as recited in claim 18 wherein said coding module is also operable to determine a value of a first group symbol of said symbol data beginning from low magnitude end of said sequence, progressively search said sequence for a second group symbol of said symbol data having a value greater than said first group symbol, to identify group symbols between and including said first group symbol and a group symbol immediately prior to said second symbol as a first segment, and to identify said second symbol as a segment separator.

* * * * *

UNITED STATES PATENT AND TRADEMARK OFFICE
CERTIFICATE OF CORRECTION

PATENT NO. : 8,305,244 B2
APPLICATION NO. : 11/787613
DATED : November 6, 2012
INVENTOR(S) : Amir Said Page 1 of 1

It is certified that error appears in the above-identified patent and that said Letters Patent is hereby corrected as shown below:

In column 10, line 44, in Claim 1, after "plurality" delete "of said plurality".

In column 12, line 9, in Claim 15, after "plurality" delete "of said plurality".

In column 12, lines 63-64, in Claim 19, after "plurality" delete "of said plurality".

Signed and Sealed this
Nineteenth Day of February, 2013

Teresa Stanek Rea
*Acting Director of the United States Patent and Trademark Office*